United States Patent
Giles et al.

(10) Patent No.: US 6,285,707 B1
(45) Date of Patent: Sep. 4, 2001

(54) TEMPERATURE COMPENSATION FOR COMMUNICATIONS CARDS

(75) Inventors: Rick Giles, Sandy; Curtis Tengan, Bountiful, both of UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/080,084

(22) Filed: May 15, 1998

(51) Int. Cl.[7] ........................................................ H04L 5/16
(52) U.S. Cl. .......................... 375/222; 379/398; 379/404
(58) Field of Search ..................................... 375/222, 224; 379/402, 403, 404, 345, 398, 399

(56) References Cited

U.S. PATENT DOCUMENTS

| | | | | |
|---|---|---|---|---|
| 5,440,305 | * | 8/1995 | Sigmore et al. | 341/120 |
| 5,488,638 | * | 1/1996 | Brown et al. | 341/119 |
| 5,506,900 | * | 4/1996 | Fritz | 379/402 |
| 5,612,677 | * | 3/1997 | Baudry | 340/584 |
| 5,809,068 | * | 9/1998 | Johnson | 375/222 |
| 5,935,466 | * | 8/1999 | Knudsen | 219/209 |

* cited by examiner

Primary Examiner—Stephen Chin
Assistant Examiner—Dac V. Ha
(74) Attorney, Agent, or Firm—Workman, Nydegger & Seeley

(57) ABSTRACT

Methods and apparatus for providing temperature compensation for a communications card, such as a modem or network card, to minimize retrain sequences between the communications card and another communications card during periods of temperature build-up within the communications card are disclosed. It is a feature of the invention to provide this temperature compensation regardless of the speed or temperature of arriving at a steady state temperature and regardless of the make of the communications card, host computer or computing temperature environment under examination. In a preferred embodiment, a keyword between the communications card and a host computer is compared to provide unique heat compensation for these two devices that have generally different, but consistent, heating characteristics. If the keywords do not match, a plurality of original delta values are developed in accordance with the heating characteristics between the communications card and the host computer for adjusting filter coefficients of a DSP in the communications card. Whereas, if the keywords match, a set of initial delta values having previously been developed are set. A temperature is monitored within the communications card so that whenever the monitored temperature exceeds a preselected threshold, the filter coefficients are adjusted by a delta value. The delta value corresponds to a preselected temperature range and is stored in a fast storage device to minimize the time required to alter the coefficients from one temperature range to the next. This minimizes the retraining sequences between the communications card and the another communications card. Ultimately, net character transmission throughput between the communications cards is improved and faster communications result. In one embodiment, heat or temperature is sensed by a thermistor and provided to the DSP for retrieval of the delta values from a fast storage device whenever the ambient temperature within the communications card exceeds some temperature threshold.

25 Claims, 4 Drawing Sheets

TEMPERATURE COMPENSATION FOR COMMUNICATIONS CARDS

BACKGROUND OF THE INVENTION

1. The Field of the Invention

The present invention relates generally to communications cards such as PCMCIA-architecture style modem or network cards. More specifically the present invention relates to compensating for heat build-up or temperature changes therein.

2. The Relevant Technology

As computer housings have downsized, internal spatial restrictions have required the establishment of standards for the internal accessories of the computer. One set of standards applicable to memory cards has been developed by the Personal Computer Memory Card International Association (PCMCIA). This organization is comprised of hundreds of manufacturers of memory cards and related peripheral equipment. By convention, the PCMCIA has determined that the spatial standard for all memory cards used in down-sized computers should be restricted to a rectangular space approximately 55 mm in width, 85 mm in length, and either 3.3, 5 or 10.5 mm in depth.

To assure themselves of compatibility and spatial conformity with computers utilizing the PCMCIA standards, internal modem manufacturers have adopted these same spatial standards for their down-sized communications cards. Other communications cards complying with the PCMCIA standards include, but are not limited to, various network cards for use in a LAN or equivalents thereof.

No matter which style of communications card is used, because the size constraints imposed by the PCMCIA standard are so confined, heat has adversely been observed as building-up within the structure of the communications card. Where heretofore this problem was essentially non-existent because of adequate forced-air coolers and large, open spaces available for dissipating heat away from communications cards, this problem has become quite an industry-wide nuisance.

However, to compensate for this heat, many communications cards are configured with variable components dynamically adjusted according to temperature. For example, in a modem communications card, a digital signal processor (DSP) changes various filter coefficients according to line conditions and a measured temperature. In turn, this causes a corresponding change in modem gain. Although effective, modem communications cards experience numerous such changes because they typically require about a 10–15 minute warm-up period before a steady state temperature is achieved.

Detrimentally, adjustments of these components necessitate time-consuming retraining sequences and adaptive filtering to establish various line parameters, such as gain and equalization, between communicating modems. Moreover, it is even possible that during such retraining sequences the net character transmission throughput between the modems can be completely stopped.

Other proposed solutions for overcoming the adverse effects of heat build-up include various hardware implementations. With hardware, however, excessive board space is consumed in an already space-critical environment. Hardware also increases manufacturing costs in labor and component expense. Numerous required retraining sequences have also been reported with these devices.

Accordingly, it would be an advance to provide temperature compensation for communications cards while minimizing retraining sequences during periods of temperature change, especially heat build-up, within the communications card.

OBJECTS AND SUMMARY OF THE INVENTION

It is, therefore, an object of the present invention to provide improved temperature compensation for communications cards.

It is another object of the present invention to provide temperature compensation for communications cards that minimizes retraining sequences.

It is still another object of the present invention to provide temperature compensation for communications cards without consuming valuable board space therein.

It is yet another object of the present invention to provide economical temperature compensation for communications cards.

It is still yet another object of the present invention to provide temperature compensation for communications cards during periods of heat build-up before essentially steady-state temperature conditions are achieved.

In accordance with the invention as embodied and broadly described herein, the foregoing and other objectives are achieved by methods and apparatus that provide temperature compensation for communications cards, such as a modem or network card, to minimize retrain sequences between the communications card and another communications card during periods of heat build-up within the communications card. It is a feature of the invention to provide this temperature compensation regardless of the speed or temperature of arriving at a steady state temperature and regardless of the make of the communications card, host computer or computing temperature environment under examination.

In a preferred embodiment, a keyword between the communications card and a host computer is compared to provide unique heat compensation for these two devices that have generally different, but consistent, heating characteristics. If the keywords do not match, a plurality of original parameters are developed for the two devices in accordance with their heating characteristics. Later, this enables a faster compensation during periods of heat build-up. If the keywords match, this indicates that a set of original parameters have previously been developed, from which a plurality of initial parameters are set.

Thereafter, a temperature is monitored within the communications card so that whenever the monitored temperature exceeds a preselected threshold, temperature based adjustments occur. Preferably, the adjustments are additions of delta values to filter coefficients set for a DSP in a modem communications card. Preferably, the delta values correspond to a preselected temperature range and are stored in a look-up table in a fast storage device to minimize the time required to make adjustments from one temperature range to the next. This compensates for heat or temperature change in a fast manner, from which, the retraining sequences between the communications card and the another communications card is minimized. Character throughput therebetween is also improved.

In one embodiment, heat or temperature is sensed by a thermistor and provided to a codec or an A/D converter. The codec or A/D converter communicates with the DSP for retrieval of the delta values from a fast storage device whenever the temperature within the communications card exceeds some predetermined value.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

The present invention relates generally to communications cards, such as PCMCIA-architecture style modem or network cards, having novel temperature compensatory methods and apparatus for speeding up adaptive filtering and minimizing retraining sequences with other communications cards during periods of temperature change or heat build-up therein. It is a feature of the present invention to speed up adaptive filtering and minimize retraining sequences by providing a rapid and preselected adjustment for a plurality of filter coefficients by a delta value whenever an ambient temperature within the communications card exceeds a preselected temperature threshold.

Before describing the preferred embodiments, it should be appreciated that the present invention will be described in terms of a communications card received by a host computer, such as a PC or laptop, for transmission and reception of data as between two or more locations. As such, it should also be appreciated that temperature build-up within a communications card is not only a function of the communications card configuration, but a function of the host computer and the computing temperature environment. Moreover, since each communications card and host computer heats up differently, i.e., the temperature value and the speed of arriving at a steady state temperature, the present invention is directed towards matching the communications card and host computer together regardless of which communications card, host computer or computing temperature environment is at issue. For brevity, the communications card and host computer may sometimes be collectively referred to as the "two devices" or "devices".

Figure 1:
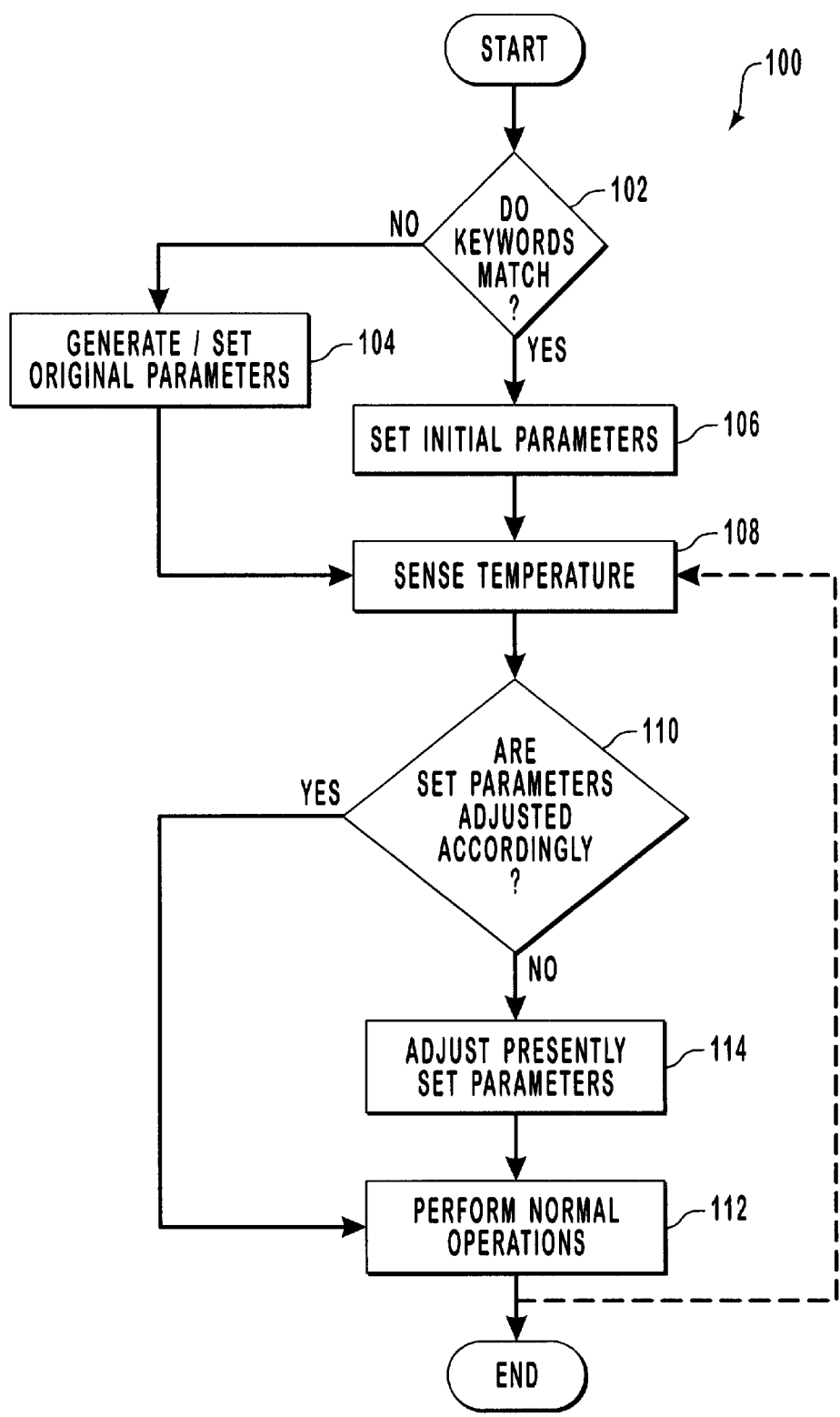
FIG. 1 is a flow diagram of the hierarchical operation for providing temperature compensation to a communications card in accordance with the present invention.

With reference to FIG. 1, a hierarchical operation providing temperature compensation for a communications card in accordance with the present invention is depicted generally as method 100. Since communications cards are frequently rotated and/or exchanged between various host computers it is preferred to ascertain whether or not the communications card and host computer have ever before been matched together. Thus, at step 102, a determination is made regarding whether a keyword in a communications card and corresponding host computer matches. A match between keywords indicates that the host computer and communications cards have previously been matched together. Whereas, no match indicates that the communications card and host computer have never been used together or that they have never been matched together. Preferably, this determination is made between the communications card and host computer prior to or when the phone connection between the two locations transmitting data is established.

At step 104, if there is no match between keywords, a set of original parameters are generated and set between the communications card and host computer that correspond to the generally consistent heating characteristics of the two devices. These parameters are originally established so that the next time the communications card and host computer are turned on, and keywords are compared, a match will occur. Thus, step 104 is substantially only used whenever these two devices are originally used. In this manner, the eventual heat compensation therebetween will be substantially guaranteed as unique for these two devices. It should be appreciated that the original parameters are a set of values that correspond to some temperature value or temperature range.

In a preferred embodiment, these original parameters are a plurality of delta values useful for adjusting filter coefficients in a digital signal processor (DSP) housed within a modem communications card. In this embodiment, when a phone connection is established between the two data communicating locations, DSP filter coefficients setting line equalization and echo canceling, for example, are computed and implemented based on the phone connection. Thereafter, when a retraining sequence occurs or the filter adapts itself because of temperature change, a new set of DSP filter coefficients are generated. The difference between the previous set and the new set of filter coefficients are computed which represent the delta value according to the changed temperature.

If the keywords match at step 102, this indicates that the host computer and communications cards have previously been correlated or matched together and so an existing set of original parameters between the two devices already exists. As such, some or all of those existing original parameters are set as the initial parameters, step 106. Similar to the original parameters, it should be appreciated that whatever values are embodied within the initial parameters, these parameters correspond to some temperature value or temperature range. Preferably, these initial parameters are the delta values generated during some previous phone connection as a function of the existing line conditions and are useful in adjusting the DSP filter coefficients.

Regardless of whether the set parameters are original (step 104) or initial (step 106), at step 108, a temperature is sensed or measured within the communications card because as the communications card is utilized, the communications card changes temperatures. In a modem, for example, this temperature change adversely prevents the filter in the DSP from properly tracking changes and a retraining sequence occurs. As used herein, this measured temperature is referred to as the "sensed temperature".

At step 110, once the sensed temperature is measured, a determination is made regarding whether the presently set parameters, i.e., original or initial, are adjusted accordingly. This is done by comparing the sensed temperature to the "present temperature" which is the temperature value or temperature range corresponding to the presently set parameters.

With respect to the sensed temperature, it should be appreciated that numerous devices and methodologies are available to sense or measure the sensed temperature. Preferably the sensing includes either a sensing at preselected intervals of time or in a continual manner. Both have advantages over the other. For example, if sensed at preselected intervals of time, the comparison between the sensed temperature and the present temperature would only need to be performed at discrete times which could eliminate excessive circuitry complication. On the other hand, a continual sensing of the temperature could allow for an essentially instantaneous change to occur whenever the sensed temperature exceeds some predetermined value such as the present temperature.

Regardless of which sensing is utilized, the sensed temperature is preferably measured as an ambient temperature within a housing of the communications card. Yet, this should not be construed as limiting because the temperature could alternatively be measured according to an operating temperature of a particular component, such as a codec, transformer or a DSP. All these devices are well known in a communications card and are not described herein in detail.

An example of comparison between the sensed and present temperature is as follows: if the sensed temperature equals 73° F. and the present temperature corresponds to presently set parameters having a temperature range of 70–75° F., the presently set parameters would be determined to be adjusted accordingly. Then, normal operations between the communications card and the host computer can be performed at step 112. In contrast, if the sensed temperature equals 80° F., the presently set parameters are determined not to be adjusted accordingly. So, at step 114, adjustment of the presently set parameters occurs until thermal stability or a steady state between the sensed temperature and the present temperature value or range is achieved.

It should be appreciated that the adjustment of the presently set parameters at step 114 is performed by simply retrieving the appropriate delta values from a look-up table by means of a pointer or index pointing to the sensed temperature of 80° F. The advantage of this is realized because the delta values are already known to correspond to this temperature and so retraining sequences between communications cards exchanging data need not occur. In turn, this avoids the unnecessary stoppage of net character transmission throughput between the communications cards.

Figure 2:
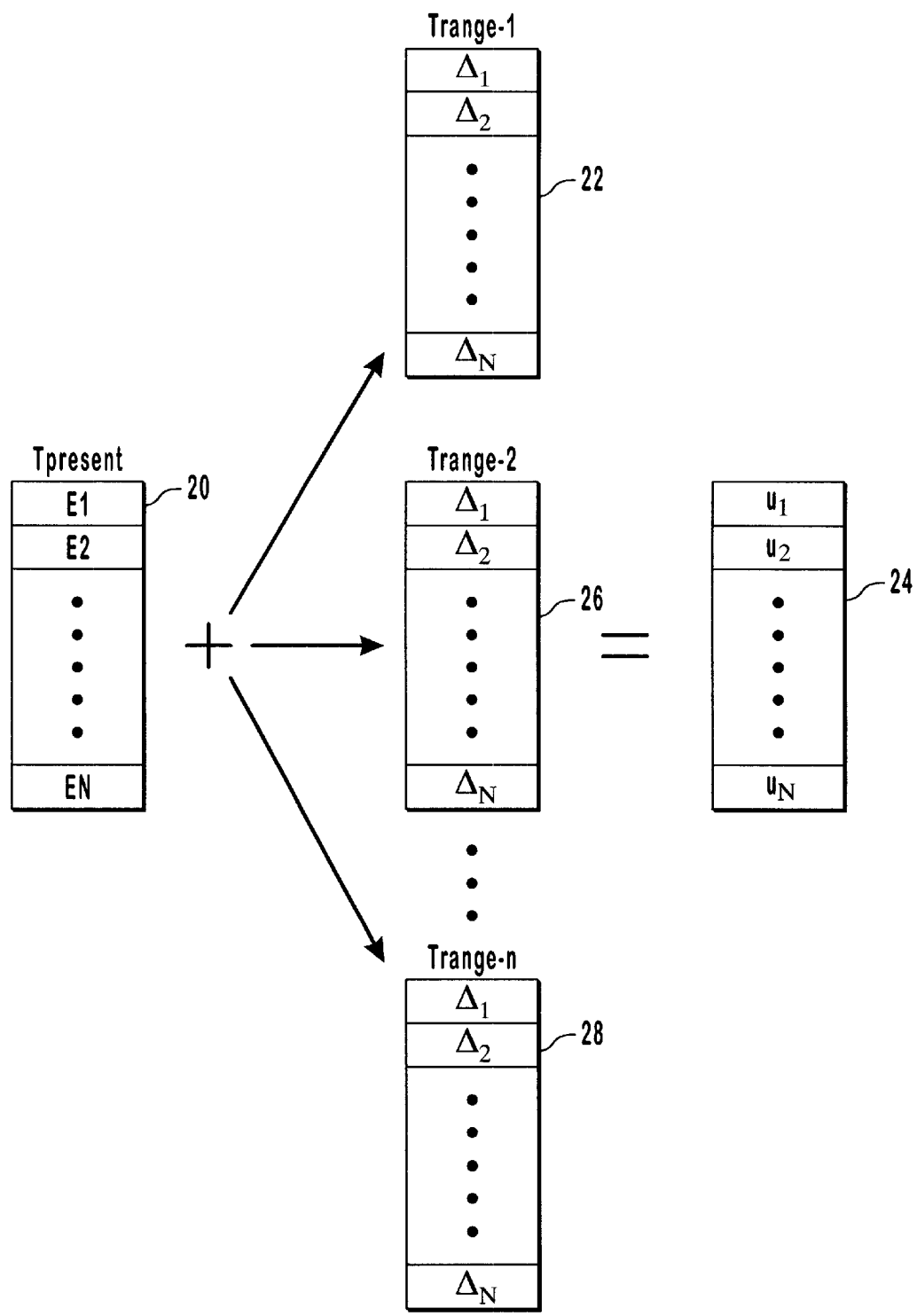
FIG. 2 is a diagram of exemplarily adjusting filter coefficients in a DSP of a modem communications card in response to changes in temperature as invoked by the routine of FIG. 1.

An exemplary preferred embodiment of adjusting the presently set parameters for a communications card in response to changes in temperature is illustrated in FIG. 2. In this figure, the adjustments are described in relation to changing filter coefficients for a DSP in a modem communications card. In table 20, the filter coefficients E1, E2, . . . . EN are logged in relation to the present temperature.

During use, as temperature increases or heat builds-up within the communications card and the sensed temperature exceeds either the present temperature, or a range containing the present temperature, the filter coefficients are adjusted according to the sensed temperature. In this embodiment, the adjustment corresponds to adding an appropriate delta value, $\Delta$, thereto.

For example, if the sensed temperature is 62° F. and the first temperature range, $T_{range1}$, corresponds to $60 < T_{sensed} < 65°$ F., and the second temperature range, $T_{range-2}$, corresponds to $65 < T_{sensed} < 70°$ F., the delta values stored in table 22 would be added to the filter coefficients such that:

E1 (filter coefficients)+$\Delta_1(T_{range1})$=U1 (adjusted or updated filter coefficients) logged in table 24. This mathematical operation would be effectuated for each delta value from $\Delta_1$ to $\Delta_n$. Whereas, if the sensed temperature equals 66° F., the delta values stored in table 26 would be added. During any subsequent increases in temperature, it should be appreciated that it is the updated, U, filter coefficients that would be adjusted.

It should also be appreciated that the delta values correspond to numerous temperature ranges or values and are preselected according to various preferences. They are indicated by ellipses extending from table 26 through table 28 corresponding to the $n^{th}$ temperature range, $T_{range-n}$.

Again, the delta values are preferably logged in a look-up table according to their temperature range to which a pointer indicates which delta values are to be added to the filter coefficients. Look-up tables and pointers are well known in the art and are not described further herein in detail.

Although the mathematical operator is described as an adder, a subtraction of delta values is also included herein because subtraction is simply the addition of negative delta values. Alternatively, the mathematical operator could equally be a subtractor, a multiplier, a divider, combinations thereof, an algorithm or any other operator to which the filter coefficients are adjusted according to the sensed temperature.

Although the temperature has been described herein as a build-up or an increase within the communications card, it is equally plausible within the context of this invention that temperature changes such as decreases or combinations of increase and decrease, could benefit from delta values established in relation to some temperature. As such, the pointer points to a delta value according to a temperature range, or value, according to the sensed temperature regardless of whether the sensed temperature has increased or decreased from the present temperature.

Figure 3:
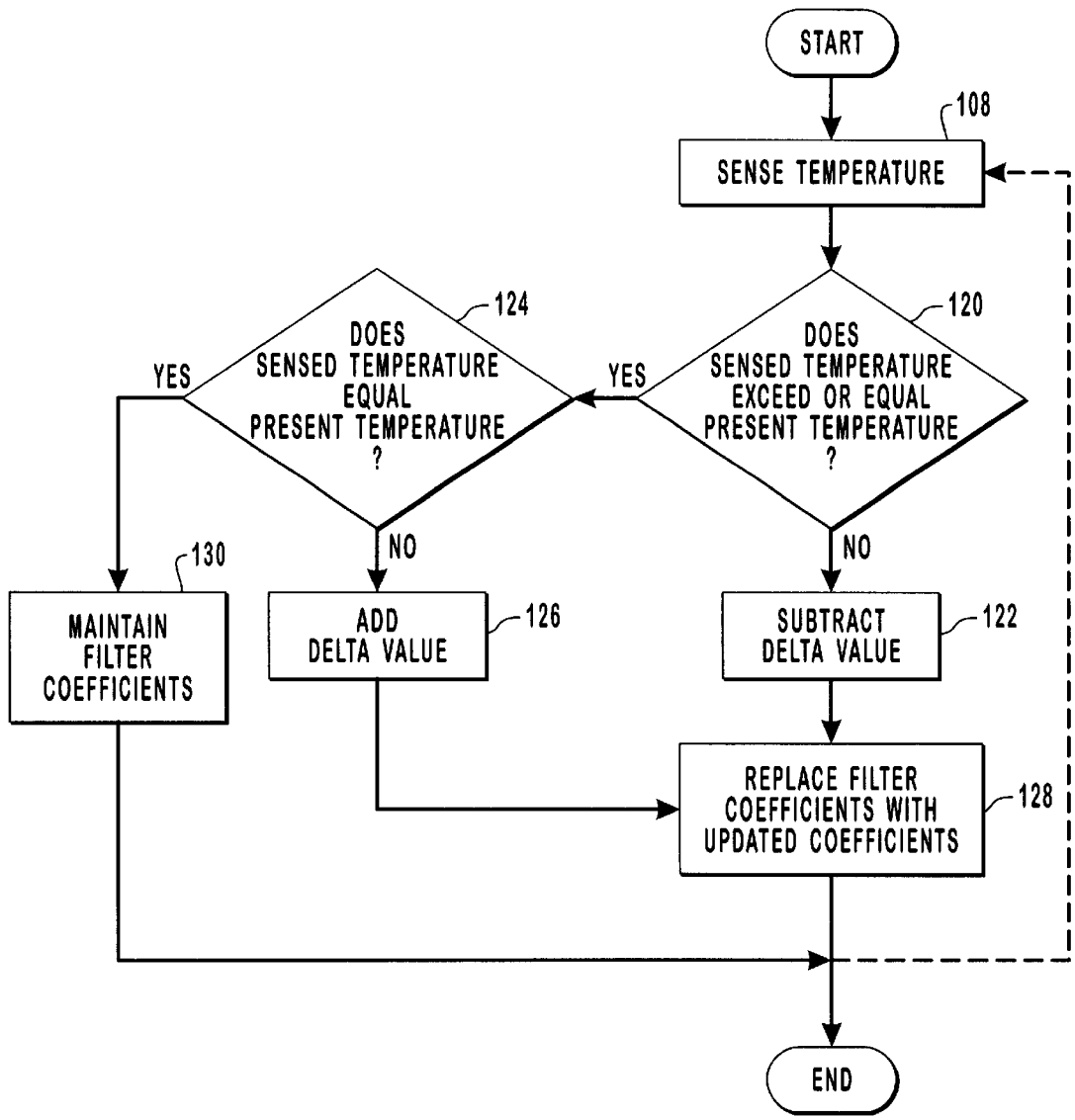
FIG. 3 is a flow diagram of exemplarily adjusting coefficients in a communications card according to sensed temperature values.

An exemplary flow diagram for adjusting filter coefficients in a communications card according to an increased or decreased sensed temperature value is illustrated with reference to FIG. 3. In this figure, at step 120, after the temperature is sensed (step 108), a determination is made regarding whether the sensed temperature exceeds or equals the present temperature. If the sensed temperature does not exceed or equal the present temperature, a temperature decrease has occurred and, at step 122, the delta values are subtracted from the filter coefficients.

If the sensed temperature does exceed or equal the present temperature, a further determination is made at step 124 to determine whether the sensed temperature equals the present temperature. If the sensed temperature does not equal the present temperature, a temperature increase has occurred and, at step 126, the delta values are added to the filter coefficients. Regardless of whether an increase or decrease occurred, at step 128, the filter coefficients are replaced with the updated coefficients as described previously, to which, the updated coefficients are adjusted during subsequent temperature changes. If the sensed temperature does equal the present temperature, no increase or decrease has occurred and, at step 130, the filter coefficients are maintained.

This process is repeated until a steady state temperature is achieved as indicated by the dashed line. Again, this sensed temperature may be obtained at preselected time intervals, continuously or according to another selection process.

However, the foregoing should be construed as merely representative and not as limitative because the mathematical operation of adding or subtracting delta values could be any operation such as multiplication, division, combinations thereof or even mathematical algorithms. Likewise, the temperature change should be construed as representative because the temperature changes could also be vacillating temperatures or various combinations of increasing and decreasing temperatures or any other temperature change.

Figure 4:
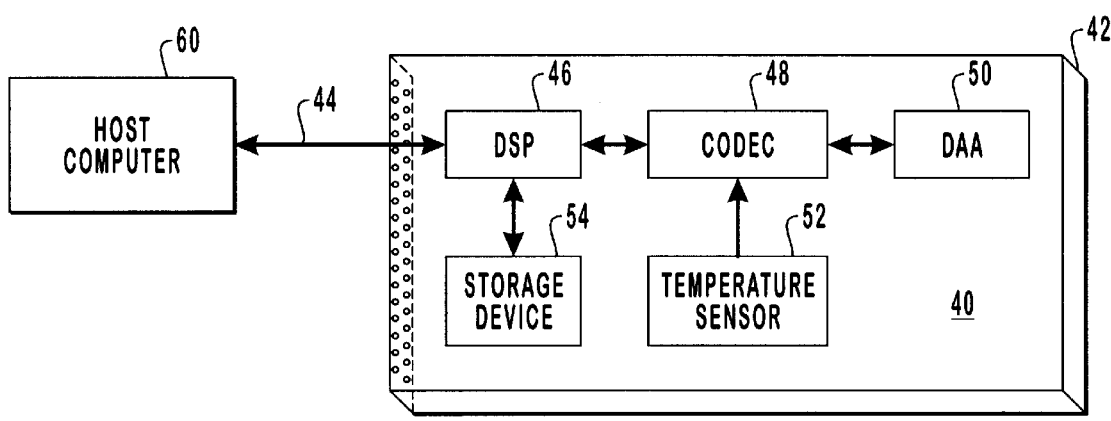
FIG. 4 is a block diagram of an exemplary communications card having components arranged therein to provide temperature compensation in accordance with the present invention.

With reference to FIG. 4, a block diagram of components for providing temperature compensation during periods of temperature change is depicted in a housing 40 of a communications card 42. In this embodiment, the communications card is in bi-directional communication with a host computer 60 by way of bidirectional communication lines 44 well known in the art.

Communicating with the host computer 60 is a controller such as an ASIC or DSP 46. The DSP and the host computer are used for matching keywords therebetween as previously described. The DSP is bi-directionally in electrical communication with an A/D converter or a codec 48 which is in bi-directional electrical communication with a DAA circuit 50. Although not shown, the DAA circuit is interfaced with a communications line, such as a telephone line. The DSP, ASIC, A/D converter, codec and DAA are all well known in the art and are not described herein in detail.

A temperature sensor 52 is in communication with the codec or A/D converter to provide the sensed temperature from within the communications card 42. As before, this sensed temperature can be the ambient temperature therein, but is not required to be. Preferably, the temperature sensor is a thermistor or a temperature sensitive diode or any other device useful in detecting a temperature value. It is even possible to integrate a temperature sensor directly into a device such as the codec or DSP.

A storage device 54 for storing the delta values according to various temperatures is in electrical communication with the DSP 46. Preferably, the storage device is non-volatile and represents fast storage means such as those embodied in a flash RAM or a serial EEPROM. To provide the advantage of increased speed in performing updates to the presently set parameters the delta values are preferably copied from non-volatile RAM to faster SRAM during the initial power-on sequence.

During use, the present temperature is stored and compared to the sensed temperature value obtained by the temperature sensor 52. If a change to the presently set parameters needs to occur, the codec indicates to the DSP the appropriate stored temperature-dependent delta values to be retrieved in order to adjust the presently set filter coefficients of the DSP.

In this manner, the present state of the art is advanced because the look-up tables provide known parameters adjusted according to heating characteristics which can be quickly implemented without requiring lengthy temperature compensation for a communications card that will heat up in substantially the same manner every time. Once the look-up table of delta values is configured according to possible temperature ranges or values, excessive time expended on retraining sequences between two locations transferring data is avoided. Moreover, if retraining sequences are shortened and/or avoided, net character transmission throughput between the communications cards is increased. Ultimately, data communications is improved.

Instead of performing mathematical operations with known delta values, in an alternate embodiment it is possible to update and store complete tables of filter coefficients for each temperature value or range. Then instead of using a mathematical operator for adjusting filter coefficients, completely new filter coefficients could be substituted in their entirety. This, however, requires additional storage space.

It is also within the scope of this invention that adjustment of the presently set parameters is initiated by a timing sequence without regard for sensing a temperature within the communications card. For example, because it can be observed how a particular communications card will increase in temperature over time, at preselect intervals of time, the filter coefficients could adjusted by a delta value at a particular time instead of upon reaching a certain temperature value or range.

In another alternate embodiment, the host computer can be matched to a plurality of communications cards substantially simultaneously, or separately, each according to a unique keyword.

In a preferred embodiment, keywords are implemented as random numbers, such as by a clock within the host computer, or by serial numbers of the computer and/or communications card. The keywords could additionally be any of a variety of means for establishing a unique or substantially unique means of identifying devices. Thus, the foregoing should be construed as merely representative and not restrictive.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of providing temperature compensation for a communications card during periods of temperature change within said communication card, the steps comprising:

setting at least one parameter within a storage location, wherein the parameter has a value corresponding to a temperature or a temperature range that is reflective of at least one heating characteristic of the communications card and that governs at least one operating characteristic of the communications card;

sensing a magnitude of the temperature within said communications card;

comparing said sensed temperature to said at least one stored parameter and determining whether said magnitude of the sensed temperature corresponds to the at least one parameter value; and if said sensed temperature magnitude does not correspond to the at least one stored parameter value, adjusting said at least one stored parameter value so that it corresponds to the magnitude of the sensed temperature and changing the operating characteristic of the communications card in accordance with the adjusted parameter.

2. The method according to claim 1, wherein said step of setting said parameters further comprises the steps of:

determining if a keyword between said communications card and a host computer matches;

if said keyword does not match, setting a plurality of original parameters; and if said keyword does match, setting a plurality of initial parameters.

3. The method according to claim 1, wherein said comparing step comprises the step of determining whether said sensed temperature magnitude exceeds said value of the at least one stored parameter.

4. The method according to claim 1, wherein said step of adjusting said parameters according to said sensed temperature filter comprises the step of mathematically operating upon a filter coefficient of said communications card by a delta value.

5. The method according to claim 1, wherein said step of sensing said temperature within said communications card further comprises the step of taking temperature measurements at preselected time intervals or substantially continuously.

6. The method according to claim 1, wherein said step of sensing said temperature within said communications card further comprises the step of taking temperature measurements with a thermistor or a temperature sensitive diode for supplying to a codec or an A/D converter.

7. The method according to claim 4, further comprising the step of retrieving said delta value from a flash memory, EEPROM or SRAM.

8. A method for providing temperature compensation for a modem communications card during periods of heat build-up within said modem communications card, the steps comprising:
   determining if a keyword assigned to the modem communications card matches a keyword assigned to a host computer;
   if said keywords do not match, setting an operating characteristic of the communications card in accordance with a plurality of original parameters;
   if said keywords do match, setting an operating characteristic of the communications card in accordance with a plurality of initial parameters;
   sensing a magnitude of the temperature within said modem communications card;
   determining whether said one of initial and original parameters are adjusted according to said sensed temperature; and
   if said one of initial and original parameters are not adjusted according to said sensed temperature, mathematically operating upon a filter coefficient of said modem communications card with a delta value corresponding to said sensed temperature from one of said initial and original parameters.

9. The method according to claim 8, wherein said step of sensing said temperature within said modem communications card further comprises the step of taking temperature measurements at preselected time intervals or substantially continuously.

10. The method according to claim 9, wherein said step of determining whether said one of initial and original parameters are adjusted according to said sensed temperature further comprises the step of determining whether said sensed temperature exceeds a present temperature.

11. The method according to claim 10, further comprising the step of replacing said filter coefficient with an updated coefficient.

12. The method according to claim 11, further comprising the step of generating said keyword according to one of a clock and a serial number of said host computer.

13. A method for providing temperature compensation for a modem communications cards to minimize retrain sequences between said modem communications card and another communications card during periods of heat build-up within said modem communications card, the steps comprising:
   determining if a keyword assigned to the modem communications card matches a keyword assigned to a host computer;
   if said keywords do not match, setting a plurality of original delta values;
   if said keywords do match, setting a plurality of initial delta values;
   measuring a temperature within said modem communications card; and
   whenever said measured temperature exceeds a preselected threshold, adjusting a filter coefficient of said modem communications card with one delta value selected from one of said initial and original delta values, said one delta value corresponding to a preselected temperature range or value.

14. The method according to claim 13, wherein said step of measuring said temperature further comprises the step of taking a temperature measurement at preselected time intervals or substantially continuously.

15. The method according to claim 13, wherein said step of measuring said temperature further comprises the steps of measuring an ambient temperature within said modem communications card and supplying said measured ambient temperature to a DSP.

16. The method according to claim 13, wherein said step of adjusting said filter coefficient with said one delta value further comprises the step of mathematically operating upon said filter coefficient with said one delta value.

17. The method according to claim 16, whenever said measured temperature exceeds a preselected threshold, further comprising the step of replacing said filter coefficient with an updated filter coefficient, said updated filter coefficient being said one said delta value added to said filter coefficient.

18. A communications card to minimize retrain sequences between said communications card and another communications card during periods of temperature change within said communications card, comprising:
   a temperature sensor for measuring an ambient temperature within a housing of said communications card at predetermined time intervals;
   a memory storage device for storing a plurality of delta values corresponding to a preselected temperature range; and
   a controller electrically coupled between said temperature sensor and said storage device for adjusting a plurality of filter coefficients by said delta values whenever said ambient temperature exceeds a present temperature.

19. The communications cards according to claim 18, wherein said temperature sensor is one of a thermistor and a temperature sensitive diode.

20. The communications cards according to claim 18, wherein said controller is further electrically coupled to a host computer.

21. The communications cards according to claim 20, wherein said controller and said host computer each further comprise a keyword for matching therebetween.

22. The communications cards according to claim 18, wherein said controller is a digital signal processor or an ASIC.

23. The communications cards according to claim 18, wherein said storage device is one of a flash RAM, a serial EEPROM and a SRAM.

24. A modem communications card to minimize retrain sequences between said communications card and another communications card during periods of temperature build-up within said communications card, comprising:

- a temperature sensor for measuring an ambient temperature within a housing of said communications card at predetermined time intervals;
- a flash memory for storing a plurality of delta values corresponding to a preselected temperature range; and
- a digital signal processor electrically coupled between said temperature sensor and said flash memory for mathematically operating upon a plurality of filter coefficients with said delta values whenever said ambient temperature exceeds a temperature threshold.

25. A system for transmitting data streams while minimizing retrain sequences between a plurality of communications cards during periods of temperature build-up within one of said communications card, comprising:

- a host computer having a first keyword electrically coupled to said one of said communications cards, said one of said communications cards having
- a second keyword for matching to said first keyword;
- a temperature sensor for measuring an ambient temperature within a housing of said one of said communications card at predetermined time intervals;
- a storage device for storing a plurality of delta values corresponding to a preselected temperature range; and
- a digital signal processor electrically coupled to said host computer and coupled between said temperature sensor and said flash memory for adjusting a plurality of filter coefficients by said delta values whenever said ambient temperature exceeds a temperature threshold.

* * * * *

UNITED STATES PATENT AND TRADEMARK OFFICE
CERTIFICATE OF CORRECTION

PATENT NO. : 6,285,707 B1
DATED : September 4, 2001
INVENTOR(S) : Rick Giles and Curtis Tengan It is certified that error appears in the above-identified patent and that said Letters Patent is hereby corrected as shown below:

Column 6,
Line 3, change "<65°" to -- ≤65° --
Line 4, change "<70°" to -- ≤70° --

Column 7,
Line 17, after "way of" change "bidirectional" to -- bi-directional --
Line 67, after "communication" change "is" to -- are --

Column 8,
Line 14, after "could" and before "adjusted" insert -- be --

Column 9,
Line 7, after "ture" change "filter" to -- further --

Signed and Sealed this

Thirteenth Day of May, 2003

JAMES E. ROGAN
*Director of the United States Patent and Trademark Office*